United States Patent
Kirchner et al.

(10) Patent No.: US 9,847,751 B2
(45) Date of Patent: Dec. 19, 2017

(54) TECHNIQUES FOR OPTIMIZING PHOTO-VOLTAIC POWER VIA INDUCTIVE COUPLING

(71) Applicant: International Business Machines Corporation, Armonk, NY (US)

(72) Inventors: Peter D. Kirchner, Putnam Valley, NY (US); Yves C. Martin, Ossining, NY (US); Theodore G. van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 453 days.

(21) Appl. No.: 14/446,872

(22) Filed: Jul. 30, 2014

(65) Prior Publication Data
US 2016/0036376 A1 Feb. 4, 2016

(51) Int. Cl.
H02J 1/00 (2006.01)
H02J 3/00 (2006.01)
H02S 50/10 (2014.01)
H01L 31/02 (2006.01)

(52) U.S. Cl.
CPC ........ H02S 50/10 (2014.12); H01L 31/02021 (2013.01); *Y02E 10/50* (2013.01)

(58) Field of Classification Search
CPC .......... H02S 40/32; H02S 40/34; H02S 50/00; H02S 50/10; H02S 40/10; H02S 40/38; H02S 40/425
USPC .......................................................... 307/82
See application file for complete search history.

(56) References Cited

U.S. PATENT DOCUMENTS

| 6,005,788 A | * | 12/1999 | Lipo | H02M 7/49 363/71 |
| 7,839,023 B2 | * | 11/2010 | Jacobson | H02M 1/42 307/77 |
| 8,076,792 B2 | | 12/2011 | Shima et al. | |
| 8,174,856 B2 | | 5/2012 | Chapman | |
| 8,335,090 B2 | | 12/2012 | Huang et al. | |

(Continued)

OTHER PUBLICATIONS

A. Bidram et al., "Control and Circuit Techniques to Mitigate Partial Shading Effects in Photovoltaic Arrays," IEEE Journal of Photovoltaics, vol. 2, No. 4, Oct. 2012, pp. 532-546.

(Continued)

*Primary Examiner* — Jared Fureman
*Assistant Examiner* — Esayas Yeshaw
(74) *Attorney, Agent, or Firm* — Vazken Alexanian; Michael J. Chang, LLC (57) ABSTRACT

Techniques for optimizing power production from photo-voltaic systems using, e.g., inductive coupling, are provided. In one aspect, a method of optimizing photo-voltaic generated power from a string of photo-voltaic devices is provided. The method includes the step of: providing corrective power to at least one photovoltaic device in the string of photo-voltaic devices to boost performance of the at least one photovoltaic device and thereby increase overall the photo-voltaic generated power from the string of photo-voltaic devices, wherein the corrective power is from about 1% to about 5%, and ranges therebetween, of the photo-voltaic generated power from the string of photo-voltaic devices. A system for optimizing photo-voltaic generated power from a string of photo-voltaic devices and a method for use thereof are also provided.

21 Claims, 6 Drawing Sheets

(56) References Cited

U.S. PATENT DOCUMENTS

| | | | |
|---|---|---|---|
| 8,406,019 B2 | 3/2013 | Garces et al. | |
| 8,422,249 B2 | 4/2013 | Cooper et al. | |
| 8,780,592 B1* | 7/2014 | Jones | H02J 3/383 |
| | | | 323/906 |
| 2012/0008356 A1* | 1/2012 | Suntio | H02M 3/33507 |
| | | | 363/131 |
| 2012/0042588 A1 | 2/2012 | Erickson, Jr. | |
| 2012/0127764 A1 | 5/2012 | Phadke et al. | |
| 2012/0306279 A1* | 12/2012 | Garabandic | H02J 3/383 |
| | | | 307/85 |
| 2013/0026842 A1* | 1/2013 | Arditi | H02J 1/10 |
| | | | 307/82 |
| 2013/0063117 A1 | 3/2013 | Lee | |
| 2013/0076134 A1 | 3/2013 | Smith et al. | |
| 2013/0200709 A1 | 8/2013 | Kirchner et al. | |
| 2014/0352760 A1* | 12/2014 | Haynes | H02J 50/12 |
| | | | 136/246 |
| 2015/0270731 A1* | 9/2015 | Adelmann | H02J 7/35 |
| | | | 320/101 |
| 2016/0105028 A1* | 4/2016 | Caraglio | H01L 31/02021 |
| | | | 307/78 |

OTHER PUBLICATIONS

H.A. Sher et al., "Micro-inverters—Promising solutions in solar photovoltaics," Energy for Sustainable Development, vol. 16, No. 4, Dec. 2012, pp. 389-400.

E. Karatepe et al., "Voltage based power compensation system for photovoltaic generation system under partially shared insolation conditions," Energy Conversion and Management, vol. 49, No. 8, Mar. 2008, pp. 2307-2316.

* cited by examiner

TECHNIQUES FOR OPTIMIZING PHOTO-VOLTAIC POWER VIA INDUCTIVE COUPLING

FIELD OF THE INVENTION

The present invention relates to photo-voltaic power systems and more particularly, to techniques for optimizing power production from photo-voltaic systems, e.g., using inductive coupling, by providing a small amount of corrective power to weak performing photo-voltaic components to produce a proportionally large increase in photo-voltaic power.

BACKGROUND OF THE INVENTION

At the heart of photo-voltaic power systems are photo-voltaic cells that utilize semiconductor junctions. In contrast to other more traditional electrical power generators, photo-voltaic cells are very non-linear devices. Specifically, the output power delivered by a photo-voltaic cell is a very non-linear function of the load resistor applied to the cell. To maximize the power generated by a photo-voltaic cell or a photo-voltaic panel, a complex electronic circuit is needed to optimize the receiver load connected to the cell or panel. In most systems, this circuit is contained within a DC-to-AC inverter that connects the photo-voltaic cells or panels (which produces DC power) to the electrical grid (which delivers AC power). This circuit is often referred to as a Maximum Power Point (MPP) tracking circuit. Effectively, an MPP tracking circuit optimizes the input impedance of the inverter to operate at the maximum power point of the attached solar panels. An exemplary MPP tracking circuit for solar cell panel applications is described in U.S. Patent Application Publication Number 2013/0063117 A1 filed by Ki Su Lee, entitled "Maximum Power Point Tracking Method," the contents of which are incorporated by reference as if fully set forth herein.

Inverters with a MPP tracking circuit often connect a large number of photo-voltaic panels to the electrical grid. The cost of the inverter is a significant fraction of the overall cost of the photo-voltaic system, and large inverters (from 10 s of kW to MW power) typically carry a lower cost-per-unit power than small inverters. Therefore the MPP tracking for power optimization is done on a large array of photo-voltaic panels in order to amortize the cost, and not on each photo-voltaic panel individually. However, since photo-voltaic panels are different from each other due to manufacturing variations, or when partial shading occurs, loading of individual photo-voltaic panels is not optimized and power production for each photo-voltaic panel is lower than what it could potentially produce. Power loss can reach 10% or more, depending on panel type, aging, and sun conditions.

Power optimization at the level of single panels does exist, either in the form of micro-inverters, or of power equalizers—both of which contain some MPP tracking electronics. However, owing to the way they operate, micro-inverters and power equalizers add substantial costs to the overall photo-voltaic system.

Therefore, effective and low cost techniques for power optimization at the level of single photo-voltaic panels would be desirable.

SUMMARY OF THE INVENTION

The present invention provides techniques for optimizing power production from photo-voltaic systems using, e.g., inductive coupling. In one aspect of the invention, a method of optimizing photo-voltaic generated power from a string of photo-voltaic devices is provided. The method includes the step of: providing corrective power to at least one photo-voltaic device in the string of photo-voltaic devices to boost performance of the at least one photovoltaic device and thereby increase overall the photo-voltaic generated power from the string of photo-voltaic devices, wherein the corrective power is from about 1% to about 5%, and ranges therebetween, of the photo-voltaic generated power from the string of photo-voltaic devices.

In another aspect of the invention, a system for optimizing photo-voltaic generated power is provided. The system includes: a string of photo-voltaic devices; and a corrective power generator connected to at least one photo-voltaic device in the string of photo-voltaic devices via a corrective power conducting line, wherein the corrective power generator is configured to provide corrective power to the at least one photo-voltaic device via the corrective power conducting line to optimize the photo-voltaic power from the string of photo-voltaic devices.

In yet another aspect of the invention, a method of using a system for optimizing photo-voltaic generated power is provided. The method includes the steps of: providing a string of photo-voltaic devices; and providing corrective power to at least one photo-voltaic device in the string of photo-voltaic devices using a corrective power generator which is connected to the at least one photo-voltaic device via a corrective power conducting line to optimize the photo-voltaic power from the string of photo-voltaic devices, wherein the corrective power is from about 1% to about 5%, and ranges therebetween, of the photo-voltaic generated power from the string of photo-voltaic devices.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for optimizing performance of photo-voltaic panels, or of individual photo-voltaic cells, or of groups of photo-voltaic cells or panels, etc. using an optimizing circuit that employs inductive coupling. In general, a photo-voltaic cell is designed to generate electric power using a light source (such as sunlight) as a power source. Multiple photo-voltaic cells are often arranged into arrays. These arrays of individual photo-voltaic cells are referred to herein as photo-voltaic panels. Arrays consisting of multiple photo-voltaic panels are sometimes used in commercial applications. The present performance optimizing techniques may be applied at any level, from that of an individual photo-voltaic cell, to groups of photo-voltaic cells, to an individual photo-voltaic panel, to groups of panels, etc. Accordingly, the term "photo-voltaic device" may be used herein to refer generically to a photo-voltaic cell or panel.

Some notable advantages of the present optimizing circuits are: 1) the optimizing circuits operate at only a fraction of the overall photo-voltaic power, e.g., on the order of 1%-5% of the overall power, yet produce an overall increase in the photo-voltaic generated power in the 1% to 50% range; 2) the optimizing circuits are isolated from the high voltage of the overall photo-voltaic circuits, and thus need lower voltage insulation; and 3) the optimizing circuits need no additional connector or in/out connections through the modules. Therefore, the present optimizing circuits can be a low cost addition to a photo-voltaic system. As will be described in detail below, the present techniques also provide the capability for dynamic tuning of individual panels or cells over time, thus allowing for refined tuning of optimum power production.

The present techniques are now described by way of reference to FIGS. 1-9. FIGS. 1A-C are diagrams illustrating the effect of corrective power on output power. As illustrated in FIGS. 1A-C, according to the present techniques it has been found that due to the unique current-voltage (I-V) characteristics of photo-voltaic cells and panels, a small amount of corrective power can have a proportionally large effect on the output power.

Specifically, a photo-voltaic installation often includes photo-voltaic panels connected in series, called strings. The main conducting line for each string carries the photo-voltaic generated power to an inverter, which transmits the photo-voltaic generated power to the grid. In each string, the power generated by each photo-voltaic panel is not equal, but depends on various factors including the quality of the photo-voltaic cells (in the panel) and/or other manufacturing details, the cleanliness of the photo-voltaic panel, the local amount of sun light that it receives, etc. Because the photo-voltaic panels are connected in series, the current flowing in each panel of a string is equal. This can force weaker panels to operate at a power level substantially lower than their optimum capacity, and in turn reduce the output power for the string. See, for example, FIGS. 1A-C which illustrates a 'good' panel (i.e., a photo-voltaic panel operating at or near its optimum capacity) in series with a weaker panel. The present techniques serve to allow each string to produce power near its optimum capacity, despite the presence of non-equally performing panels.

Figure 1A:
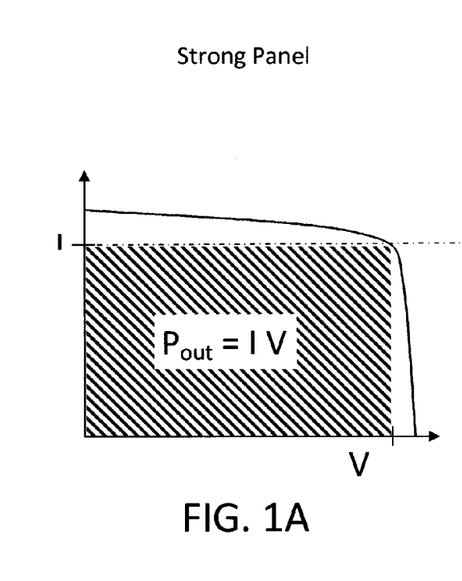
FIG. 1A is a plot illustrating the current-voltage (I-V) characteristics of a good photo-voltaic panel which can be connected in series with one or more other photo-voltaic panels according to an embodiment of the present invention.

Specifically, FIG. 1A is a plot illustrating the I-V characteristics of a good photo-voltaic panel (or photo-voltaic cell, or group of photo-voltaic cells), wherein voltage (V) is plotted on the x-axis and current (I) is plotted on the y-axis. The shaded rectangle represents power output $P_{out}$. When a photo-voltaic panel (or photo-voltaic cell, or group of photo-voltaic cells) is performing at (or near) its optimum, then the power output is at the maximum for that panel (or cell, or group of cells), i.e., $P_{out}=IV$.

Figure 1B:
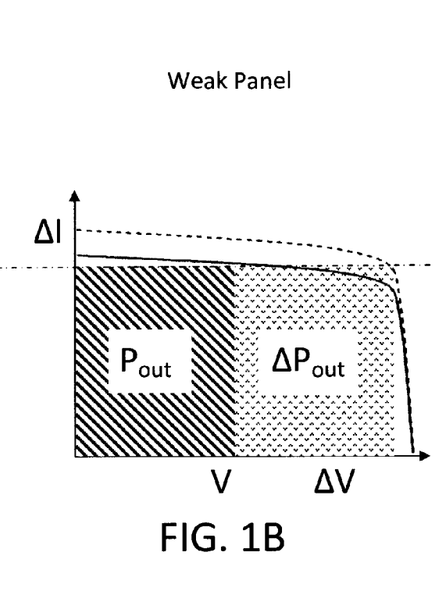
FIG. 1B is a plot illustrating the I-V characteristics of a weak photo-voltaic panel connected in series with the good photo-voltaic panel of FIG. 1A according to an embodiment of the present invention.

As shown in FIG. 1B (also an I-V plot with V plotted on the x-axis and I plotted on the y-axis), when a weak photo-voltaic panel (or photo-voltaic cell, or group of photo-voltaic cells) is connected in series with a good panel(s) (such as the good panel illustrated in FIG. 1A), then the weak panel (or cell, or group of cells) is constrained to operate at a current (I) that results in a voltage (V) and power level far below (i.e., $\Delta P_{out}$) the power at which the panel (or cell, or group of cells) is capable (even though weak) of operating.

Figure 1C:
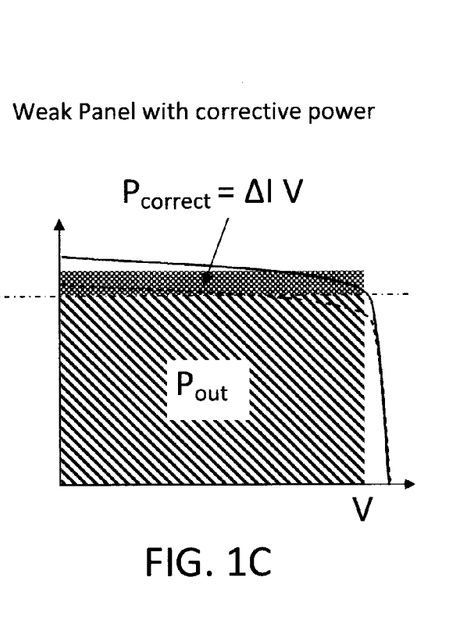
FIG. 1C is an I-V plot illustrating how a small amount of corrective power allows the weak photo-voltaic panel of FIG. 1B to operate at a level commensurate to the good photo-voltaic panel of FIG. 1A according to an embodiment of the present invention.

However, as shown in FIG. 1C (also an I-V plot with V plotted on the x-axis and I plotted on the y-axis), a small amount of corrective power $P_{correct}$ (produced using the output power—see below) allows that weak panel to operate at a level commensurate to the good panel. Specifically, as shown in FIG. 1C, because of the unique I-V characteristics of a photo-voltaic panel (or photo-voltaic cell, or group of photo-voltaic cells), a small amount of corrective power $P_{correct}$ can have a proportionally large effect on the output power $P_{out}$:

$$\Delta P_{out} >> P_{correct},$$

or $$I \Delta V >> \Delta IV.$$

Output power is also referred to herein as photo-voltaic generated power, i.e., the power generated by the string of photo-voltaic devices (e.g., panels).

It is notable that the present techniques for boosting performance of photo-voltaics using a small amount of corrective power may be generally applied at any level of photo-voltaic power production, including but not limited to, at the level of photo-voltaic panels, individual photo-voltaic cells, groups of photo-voltaic cells, etc. Thus, the photo-voltaic device or devices to which the present techniques are being employed (whether it be a photo-voltaic panel(s), a photo-voltaic cell or group of cells, etc.) may also be generally referred to herein as the "photo-voltaic module." Thus, the term "photo-voltaic module" may be used herein to refer to a photo-voltaic panel(s), a photo-voltaic cell or group of cells, etc. It is further notable that while some of the exemplary embodiments described below make reference to components inside and/or outside of a photo-voltaic component (such as inductance coils inside and outside a casing of a photo-voltaic panel), the same components may be implemented in the same manner regardless of whether the photo-voltaic components are located within a particular casing or housing. For instance, inductive coupling is advantageous since it permits coupling of panels to a corrective power source without directly contacting the panel and the corrective power circuit (thereby protecting the panel from weather conditions, etc.). However, the same inductive coupling components can be implemented with individual photo-voltaic cells, groups of cells, etc. even if they are not contained in a casing.

Figure 2:
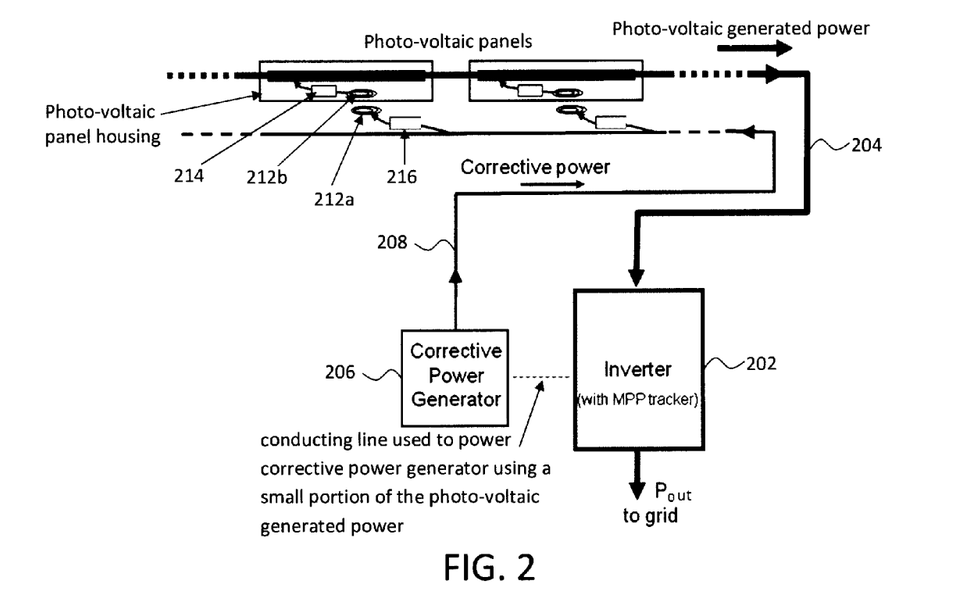
FIG. 2 is a diagram illustrating an exemplary embodiment of the present techniques where corrective power is delivered to each of the panels via inductive coupling according to an embodiment of the present invention.

According to one exemplary embodiment of the present techniques, this corrective power is delivered to each of the panels individually via inductive coupling. For instance, as shown in FIG. 2—a photo-voltaic system implementing the present corrective power circuitry—two circuit lines can be implemented, one which carries the photo-voltaic power generated by a string of photo-voltaic panels ("photo-voltaic generated power"), and a second which carries a small portion (e.g., from about 1% to about 5% and ranges therebetween) of the photo-voltaic generated power back to the panels as a corrective power. Thus, in general, the present system includes a string of photo-voltaic devices (e.g., photo-voltaic panels) an output of which is connected to an inverter; a corrective power circuit connecting the inverter individually to at least one of the photo-voltaic devices (through which the corrective power is delivered); and optionally a control signal circuit which regulates the amount of corrective power delivered to each panel individually (see FIG. 5, below).

Specifically, as with standard configurations, the photo-voltaic generated power is carried to an inverter 202 (with MPP tracker) via a main conducting line 204. However, according to the present techniques, a small portion of the photo-voltaic generated power is diverted from the inverter 202 to power a corrective power generator 206. The corrective power generator 206 produces electrical power ("corrective power") that is sent back to the photo-voltaic panels via a corrective power conducting line 208. The corrective power generator 206 has the capability to adjust the amount of this corrective power to optimize the overall photo-voltaic generated power: a small amount of corrective power increases the photo-voltaic generated power substantially, but too much corrective power has little effect.

The corrective power generator 206 can in its simplest form serve as a power supply. In that case, the corrective power generator 206 provides an AC or a DC voltage. The power that it will give to the panels (the corrective power) will be a function of the amplitude of the AC or DC voltage. Therefore, the generator will adjust the AC or DC corrective voltage so that the corrective power is optimized. The power that the generator will take from the photo-voltaic string will be slightly more (possibly 1% to 10% more) than the corrective power that it gives back to the panels.

According to an exemplary embodiment, the corrective power generator 206 is a more complex electronic circuit between the inverter 202 and the corrective power conducting line 208 that reads the photo-voltaic power generated by the panels by i) either reading the output power $P_{out}$ from the inverter 202, or by ii) measuring the overall current (I) and voltage (V) independently and calculating the photo-voltaic generated power as the product I×V. The corrective power generator 206 then generates an AC corrective voltage $V_{correct}$ in this case (i.e., it could also be a DC corrective voltage and/or more complex configurations of corrective power in other embodiments). The $V_{correct}$ generated by the corrective power generator 206 is applied to the corrective power conducting line 208 and to each panel via inductive coupling for example. The power carried by this AC voltage is the corrective power $P_{correct}$. Based on the $P_{correct}$, the corrective power generator 206 can adjust the $P_{correct}$ (by adjusting $V_{correct}$) until [$P_{out}$−$P_{correct}$] is maximized. The power supplied to the corrective power generator 206 comes from the photo-voltaic power generated by the panels and represents only a small portion (from about 1% to about 5%, and ranges therebetween) of the output power $P_{out}$ from the inverter.

In this exemplary embodiment, the corrective power generator 206 acts as a voltage source which provides the same amount of corrective voltage to each of the photo-voltaic panels. Weak panels generally exhibit a lower output voltage. Current from the voltage source tends to flow naturally to areas where the voltage is low. Thus, the corrective power supply process is self-leveling with relatively more power being delivered to the weak panels than to the good panels. However, other embodiments are provided below where additional control signals are used to further optimize the amount of corrective power sent to and/or used by individual panels.

The corrective power is delivered to each of the panels individually via inductive coupling. Inductive coupling involves using the current flow through a first wire to induce a voltage in a second wire located in close proximity to the first wire via electromagnetic induction. Typically, the wires are configured as coils positioned to face one another in close proximity, but are not connected electrically. Specifically, as shown in FIG. 2, at least one first coil 212a in the corrective power conducting line 208 and at least one second coil 212b within, and connected to, the photo-voltaic panel make-up at least one pair of inductive coupling coils for each of the photo-voltaic panels. Thus there is no direct electrical connection between the photo-voltaic panels and the corrective power conducting line 208. While a single pair of inductive coils (212a and 212b) for each photo-voltaic panel is shown in the figures, it is to be understood that multiple pairs of inductive coils may be employed in the same manner described. Employing multiple pairs of inductive coils, increasing the number of turns, in each coil, increasing the diameter of the coil(s) can each serve to increase the inductance. However, multiple coils and/or larger coils take up more space, which is a consideration. Inductance can also be increased by winding the coils onto a magnetic core, such as a ferrite core.

Each photo-voltaic panel is often encased in a weather-proof casing. See FIG. 2. Thus, in general, the inductive coupling mechanism employed herein includes at least two coils (212a and 212b), one inside (i.e., inside the photo-voltaic panel casing) and one outside each of the photo-voltaic panels, that are electromagnetically coupled to one another. The coils transmit AC electrical power from outside of the photo-voltaic panels to inside the photo-voltaic panels without direct electrical connection between the photo-voltaic panels and the corrective power circuit. In its simplest form, as shown for example in FIG. 2, the inductive coupling is made out of two coils of electrical wires, that face each other, one inside (i.e., in the panel casing) and one outside of the panel. The coils are wound and positioned such that the inductive coupling between them is efficient. As highlighted above, the implementation of the present techniques at the level of individual panels is merely one example, and the present process for providing corrective power to boost performance of a photo-voltaic device(s) may be done at the level of individual photo-voltaic cells, groups of cells, etc.

Other embodiments also include some type of magnetic circuit, as are found in electrical transformers, where part of the magnetic circuit resides inside the photo-voltaic panel and another part outside. The inductively coupled conductors of a transformer are shown and described, for example, in U.S. Patent Application Publication Number 2013/0200709 A1 filed by Peter Kirchner et al., entitled "Techniques for Grid Coupling Photovoltaic Cells Using Ratiometric Voltage Conversion," (hereinafter "U.S. Patent Application Publication Number 2013/0200709") the contents of which are incorporated by reference as if fully set forth herein. Depending on the frequency and power requirements, the panel casing might have to be an electrical insulator like a plastic, at least locally where the coils and/or magnetic circuit are placed, in order to minimize electrical losses due to Eddy currents.

With inductive coupling, there is no need to physically penetrate the casing of the panel, and there is no need of additional weather-proofed connectors. Notwithstanding, according to another exemplary embodiment, the present techniques for delivering a small amount of corrective power to boost the output of weak panels are implemented using direct connectors. Preferably, the connectors employed are resistant to weather conditions. While the use of weather-proofed connectors adds cost to the overall system, these costs may be commensurate with the hardware needed for inductive coupling.

Specifically, the cost of the inductive coupling components such as the coils and ferrite core can be significant depending on the amount of power being transmitted, wherein cost is directly proportional to the amount of power. This makes sense since a greater amount and/or number of components is/are needed to handle a greater amount of power. However, as noted above, only a relatively small amount of corrective power is needed in accordance with the present techniques. Thus, the cost of the inductive coupling components needed for a given application may in fact be less than employing weather-proofed direct connectors throughout. Further, the use of direct connectors in the case where control signals are sent through the same lines as the corrective power (see below) would require additional circuitry to electrically isolate the control signals sent to each of the panels. By way of example only, signal isolation may be achieved via inductive coupling in small separately packaged circuits (sometimes called ratiometric converters). See, for example, U.S. Patent Application Publication Number 2013/0200709. This additional circuitry needs to be considered in the overall cost of implementing weather-proofed direct connectors.

A power leveling circuit 214 is located in each photo-voltaic panel, i.e., between the photo-voltaic panel and the coil 212b. The power leveling circuit serves to convert the AC inductive coupled corrective power in the photo-voltaic panel into DC power and DC currents that can be applied to the photo-voltaic cells in the panel.

Optionally, the power leveling circuit 214 can also be configured to adjust an amount of the corrective power that is converted from AC to DC. According to an exemplary embodiment, the power leveling circuit 214 contains power control electronics. For instance, the power leveling circuit can contain electronic switches (such as one or more field-effect transistors) between the coil 212b and the panel. These electronic switches are also referred to below as dimmer switches. The power leveling circuit 214 can measure the DC voltage of the corresponding photo-voltaic panel (i.e., the $V_{panel}$) and turn the switches on during a portion of each AC cycle only. By varying the on/off ratio in each cycle (also called the duty cycle), the amount of corrective power applied to the panel can be varied. The amount of corrective power is adjusted so that $V_{panel}$ reaches a pre-determined value, or a value that is determined by the control signal generator 518, in a further implementation below.

Optionally, a power conditioning unit 216 is employed between the corrective power conducting line 208 and the pair of inductive coupling coils at each of the photo-voltaic panels. While an optional component, the power conditioning unit 216 can advantageously serve as an inverter to convert the corrective DC power to an AC voltage that is applied to the inductive coupling coils. See below. The power conditioning unit 216 can also serve to adjust the amount of the corrective power that is applied as AC voltage to the inductive coupling coil (i.e., coil 212a) outside of each photo-voltaic panel. The capability for adjustment at the power conditioning unit 216 is useful in situations, for example, where adjustments cannot be made via the power leveling components 214 (for instance, in the case where one or more of the panels are swapped out for new panels with power leveling components 214 that do not contain the above-described adjustment circuitry).

In the exemplary embodiment illustrated in FIG. 2, the corrective power generator 206 uses a portion of the power produced by the entire system (i.e., the photo-voltaic generated power) to generate a given amount of the corrective power which is returned to the photo-voltaic panels through the corrective power conducting line 208, and through the inductive coupling coils (212a and 212b) at each photo-voltaic panel. The amount of corrective power is small, e.g., from about 1 percent (%) to about 5% and ranges therebetween of the photo-voltaic generated power. But it allows current to be injected such that weak panels can operate at a level commensurate to the strong panels. This amount of the corrective power given, e.g., from about 1% to about 5% and ranges therebetween of the photo-voltaic generated power, represents both i) the amount of output power from the photo-voltaic panels that is diverted to the corrective power generator, and ii) the amount of power from the corrective power generator to the photo-voltaic panels—since these values should be the same (unless the corrective power generator is not operating properly).

As provided above, a power leveling circuit 214 is preferably provided in each photo-voltaic panel (i.e., between the photo-voltaic panel and the coil 212b) and serves to convert the AC corrective power in the photo-voltaic panel into DC power, and optionally to adjust an amount of the corrective power that is converted from AC to DC. Exemplary configurations of the power leveling circuit 214 are provided in FIG. 3 and FIG. 4. In this example, the power leveling circuit 214 includes a diode and optionally a capacitor.

As described above, the corrective power generator 206 (see FIG. 2—described above) produces an AC voltage that is applied to the induction coupling coils (here being given reference numeral 302) located within the photo-voltaic panel. The voltage level has been pre-adjusted once (i.e., so that $V_{panel}$ reaches a pre-determined value—see above), or can be continuously adjusted using an electrical feed-back circuit, which optimizes the total photo-voltaic produced power, i.e., the photo-voltaic generated power minus the corrective power as determined by the control signal generator 518—see below. In the examples shown in FIG. 3 and FIG. 4, the power leveling circuit 214 is a simple rectifier including a diode(s) (and optionally a capacitor(s)) for converting the corrective power from AC to DC within the photo-voltaic panels.

Figure 3:
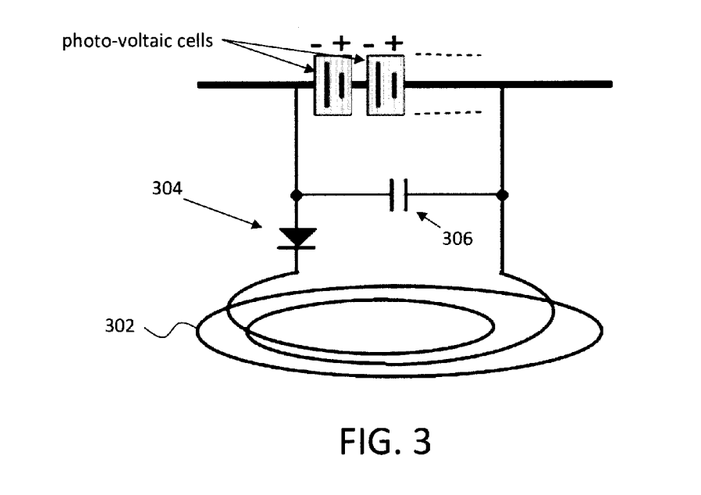
FIG. 3 is a diagram illustrating one exemplary configuration of a power leveling circuit according to an embodiment of the present invention.
Figure 4:
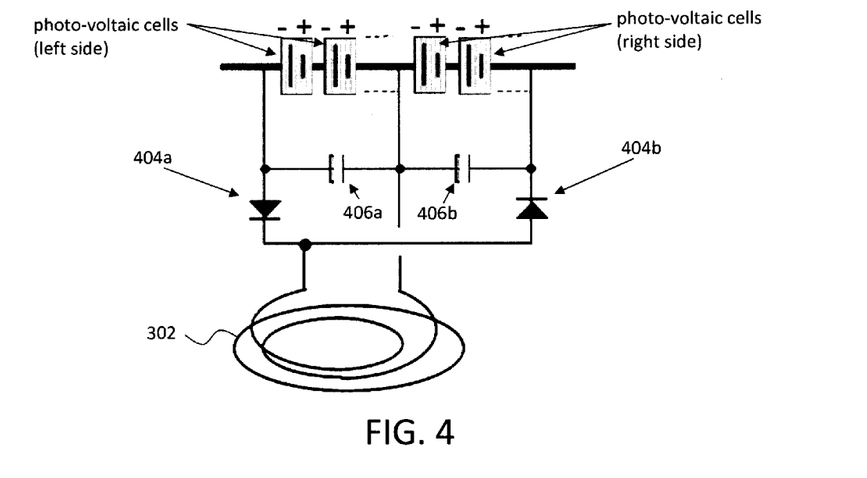
FIG. 4 is a diagram illustrating another exemplary configuration of a power leveling circuit according to an embodiment of the present invention.

Specifically, in the exemplary embodiment illustrated in FIG. 3, the rectifier includes a single diode 304 between the coil 302 and the photo-voltaic cells of the panel to provide the DC corrective current that adds to the photo-voltaic current of weak panels, and allow them to operate at higher power (see description of FIG. 1C, above). The diode 304 may be a protection diode commonly used in photo-voltaics to protect the circuits from reverse voltage and current. An optional capacitor 306 may be included in the power leveling circuit 214 to produce a smooth DC output voltage to the panel.

In the absence of corrective power, the power leveling circuit 214 has no effect on the function of the photo-voltaic panel. Specifically, the capacitance has no impact on the DC voltage of the panel, and the coil 302 acts as a near-short-circuit connection between the by-pass diode and the photo-voltaic cell(s), as is done in a standard panel.

Building on this rectifier design, the power leveling circuit 214 may alternatively include two diodes 404a and 404b (and optionally two capacitors 406a and 406b) to make better use of the inductive coupling coil 302. See FIG. 4. Specifically, by having two diodes 404a and 404b, the negative part of each AC cycle provides current in diode 404a and in the photo-voltaic panels shown in the left side of the string; and the positive part of each AC cycle provides current in diode 404b and in the photo-voltaic panels shown in the right side of the string. By contrast, with the single diode configuration shown in FIG. 3, current is only provided during half of each AC cycle. Thus the coil is inactive during the other half of the cycle.

As provided above, current tends naturally to flow to areas of low-voltage. Thus, by simply providing a source of corrective power through an AC voltage (e.g., via the corrective power generator 206) and through simple rectifiers to the panels, relatively more of the corrective power will be delivered to the weak panels than to the good panels, i.e., a self-leveling delivery process. In that case, the same amount of corrective voltage is sent to all of the photo-voltaic panels and, via the self-leveling process, a greater amount of the corrective power will naturally flow to those weaker performing panels which have a lower output voltage. In that scenario, the power leveling circuit may be configured as the simple rectifiers shown in FIG. 3 or FIG. 4.

However, it may be desirable to include some intelligence in the system for insuring that the corrective power is delivered specifically to the weak performing panels. According to an exemplary embodiment, this intelligence is provided by including (optional) power conditioning circuits 216 (see FIG. 2) in the power leveling circuit. In general, when present the power conditioning circuits 216 serve to adjust the amount of corrective power applied to individual panels. While the exemplary embodiments depicted in the figures and described herein include a power conditioning circuit 216 for each of the photo-voltaic panels, it is also possible to implement a power conditioning circuit for groups of panels. Specifically, the power conditioning circuit could be configured to adjust the amount of corrective power delivered to groups of weaker performing panels. Once the corrective power is provided to a group of photo-voltaic panels, the corrective power will then naturally flow to those individual panels in the group with low output power (see above description of the self-leveling flow process).

In its simplest form, each power conditioning circuit 216 functions like a light dimmer switch to regulate the amount of AC voltage applied to the panels (e.g., via the inductive coupling coils). By way of example only, dimmer switches can consist of a solid-state relay, or a field-effect transistor, which is turned on during a portion of each AC cycle, to regulate power flow through the switch when someone actuates a knob. Similarly, the power conditioning circuit 216 can be configured as a switch having a knob that allows a user to regulate the corrective power flow to a panel (or group of panels). Alternate configurations of a power conditioning circuit 216 as a switch include the ability to respond to electrical control signals (see below).

In the event that the corrective power generator 206 produces a DC voltage, the power conditioning circuit 216 may optionally be configured to convert that DC power to an AC voltage that is applied to the inductive coupling coils. In that case, the power conditioning circuit 216 further includes inverter circuitry. A rectifier circuit can then serve to convert the AC voltage to DC power within the panels (see FIGS. 3 and 4, described above).

Figure 5:
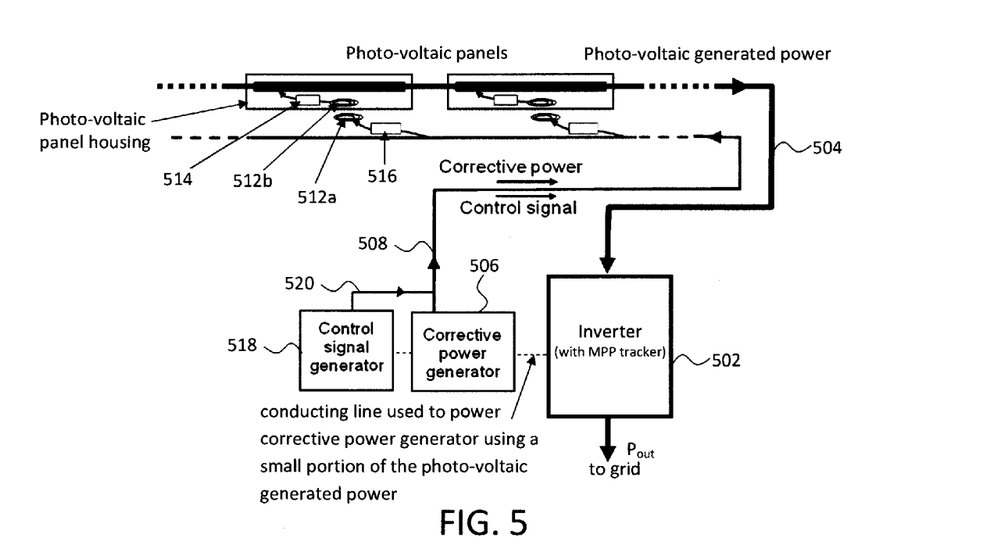
FIG. 5 is a diagram illustrating an exemplary embodiment of the present techniques wherein a control signal optimizes the amount of corrective power sent (or used by) individual panels according to an embodiment of the present invention.

Rather than sending the same amount of corrective power to each photo-voltaic panel, in an alternative embodiment, a control signal is generated and used to fine-tune the process by optimizing (individually regulating) the amount of corrective power sent (or used by) individual panels. An exemplary embodiment of the present techniques having such control signal capabilities is shown in FIG. 5 (i.e., a photo-voltaic system employing the present corrective power and optional control signal techniques). Specifically, for each panel, there is an optimum amount of corrective power that provides for an optimized photo-voltaic generated power for the whole system. Weak panels require more corrective power, whereas healthy panels require less corrective power.

As above, the photo-voltaic generated power from a string of photo-voltaic panels is carried to an inverter 502 (with MPP tracker) via a main conducting line 504. A small portion of the photo-voltaic generated power is diverted from the inverter 502 to power a corrective power generator 506 which produces electrical power ("corrective power") that is sent back to the photo-voltaic panels via a corrective power conducting line 508. As with the system shown in FIG. 2, in the exemplary embodiment illustrated in FIG. 5 the corrective power is delivered to each of the panels individually via inductive coupling. Specifically, as shown in FIG. 5, at least one first coil 512a in the corrective power conducting line 508 and at least one second coil 512b within the photo-voltaic panel make-up at least one pair of inductive coupling coils for each of the photo-voltaic panels. A power leveling circuit 514 is located in each photo-voltaic panel, i.e., between the photo-voltaic panel and the coil 512b. The power leveling circuit serves to convert the AC inductive coupled corrective power in the photo-voltaic panel into DC power and DC currents that can be applied to the photo-voltaic cells in the panel. See, for example FIGS. 3 and 4, described above, which provide some exemplary power leveling circuit configurations. A power conditioning unit 516 is employed between the corrective power conducting line 508 and the pair of inductive coupling coils at each of the photo-voltaic panels.

In the exemplary embodiment of FIG. 2, the power conditioning unit was an optional component in the system. By comparison, each power conditioning unit serves here to receive (or decode) its assigned control signal and use it to adjust the amount of electrical (corrective) power applied to each photo-voltaic panel. Thus, in order to implement control signal processing, a power conditioning unit 516 is thus needed in the system of FIG. 5.

Specifically, according to an exemplary embodiment, a control signal is generated that contains information for each panel (or groups of panels). This signal is sent from a control signal generator 518 to each of the power conditioning units through a corrective power line 520. This signal can be transmitted through its own dedicated electrical conductors, i.e., from the control signal generator 518 to the power conditioning units 516 (not shown). However, a more cost-effective solution is to encode the control signal into the same electrical conductors that transmit the corrective power. Specifically, as shown in FIG. 5, the corrective power and the control signal run through at least a portion of the same conductor, i.e., corrective power conducting line 508. Thus, in this case, line 508 may also be referred to herein as corrective power/control signal conducting line 508.

Techniques for transmitting data over power lines are present in the electronic industry. For example, power-line communication (PLC) permits data transmission on conductors simultaneously being used for power delivery. PLC operates by adding a modulated carrier signal to the conductor. Power-line communications are described, for example, in U.S. Pat. No. 8,076,792 B2, filed by Shima et al., entitled "Power line communication apparatus," the contents of which are incorporated by reference as if fully set forth herein. A specific implementation of this PLC technology is in hybrid car battery monitors, where signals are encoded on the 12 v battery lines via Max 11068 and Max 2990 smart data interfaces available from Maxim Integrated, San Jose, Calif., which permit data transmission over AC or DC power lines. Each unit includes a processor for encoding data communications over an electrical network using orthogonal frequency-division multiplexing (OFDM) modulation.

As provided above, the power conditioning circuits may serve as a switch that responds to electrical control signals. In that case each power conditioning circuit 516 receives (or decodes) its assigned control signal and uses it to adjust the amount of electrical power applied to each panel (or each group of panels). The control signal generator 518 sends individual control signals to each panel (or each group of panels) to optimize the photo-voltaic generated power. By way of example only, each power conditioning unit 516 has a unique address. The control signal generator 518 sends digital signals. Each signal includes an address and a command. According to an exemplary embodiment, each power conditioning circuit 516 has remote-control dimmer switch circuitry. For instance, a signal over the internet, or from a control module, is decoded in the dimmer, and serves to control the switch (e.g., it can vary the duty-cycle of the electronic switch in the power leveling circuit 214).

The control signal generator 518 has either been pre-set once, or can continuously adjust each individual control signal that continuously optimizes the photo-voltaic generated power. For instance, the control signal generator 518 can be pre-set once during installation of the whole system, i.e., at a time zero, or as the system ages or solar conditions change continuous adjustments can be made. By way of example only, the present techniques preferentially make use of a microprocessor that varies the corrective power applied to the panels while monitoring the photo-voltaic generated power. By iterative methods, it finds the optimal amount of corrective power for each panel (or group of panels). See for example methodology 600 of FIG. 6, described below. According to an exemplary embodiment, this microprocessor is located in the control signal generator 518. However, due to their low cost, microprocessors can be implemented throughout the system, e.g., in the corrective power generator 506 and/or in each power leveling circuit 514 and/or power conditioning unit 516 for a fully optimized system. In fact, the decoding of an address is preferably done with a microprocessor in an internet-controlled dimmer switch.

By way of example only, the control signals are also transmitted through the inductive coupling coils and received (or decoded) by the power leveling circuits 514. In this embodiment, the power leveling circuits 514 contain the necessary electronic circuitry to decode the control signal and to use it to adjust the amount of corrective power applied to the panel. As described above, the power leveling circuit can include electronic circuitry to adjust the amount of corrective power delivered to a panel, including for example switches (e.g., field-effect transistors) between the coil and the panel that based on a measured $V_{panel}$ can adjust the amount of corrective power applied to the panel. As provided above, the control signal can be a digital signal having an address (e.g., uniquely corresponding to a particular power conditioning unit) and a command. In this case, the address in the control signal uniquely corresponds to a particular power leveling circuit 514. Thus, the power leveling circuit can in some cases also provide the function of the power conditioning circuit. In which case the power conditioning circuit might not be needed. Generally however, the power leveling circuit resides inside the panels. Since panels are sourced from various manufacturers, they may or may not include a full leveling circuit.

One notable advantage of the present techniques is that the corrective power is provided to the panels via a separate electric line (i.e., via the corrective power conducting line) from the main conducting line. The main conducting lines 204 (FIG. 2) and 504 (FIG. 5) for the panels are thick and require high voltage isolation because they carry much power (high voltage and high current). The corrective power conducting lines 208 and 508, respectively, can be much thinner and much cheaper lines, which carry lower voltage and/or lower current.

Figure 6:
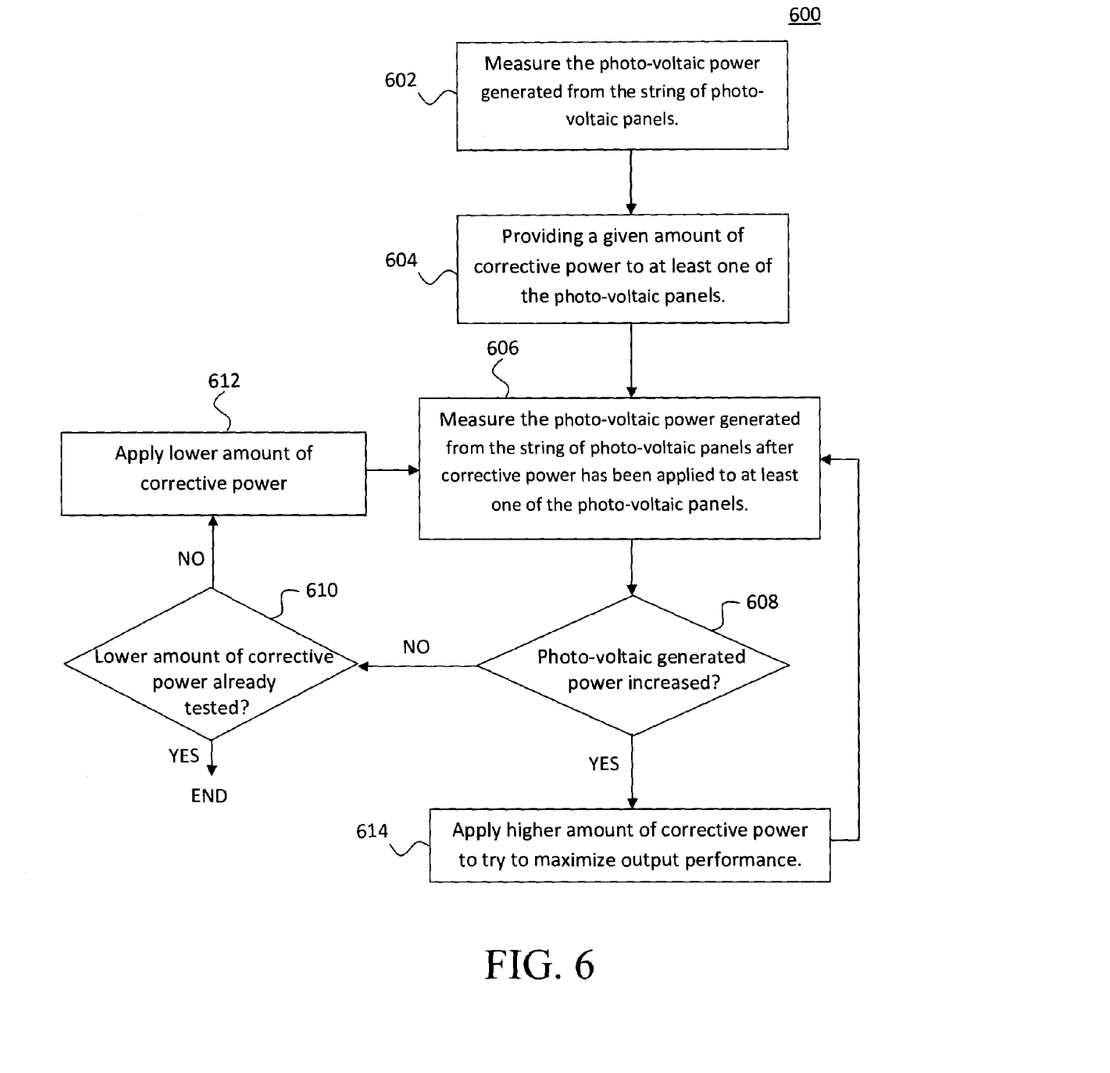
FIG. 6 is a diagram illustrating an exemplary iterative methodology for determining an optimal amount of corrective power to deliver to each panel (or group of panels) so as to optimize photo-voltaic power according to an embodiment of the present invention.

FIG. 6 is a diagram illustrating an exemplary iterative methodology 600 to determine an optimal amount of corrective power to deliver to each panel (or group of panels). In step 602, the photo-voltaic power generated from the string of photo-voltaic panels (see for example "Photo-voltaic generated power" in FIGS. 2 and 5) is measured. In a first iteration of methodology 600, the photo-voltaic generated power measured in step 602 is prior to a corrective power being applied to any of the photo-voltaic panels, and thus can serve as an initial baseline measurement against which the readings from subsequent iterations (with corrective power adjustments) can be made. Specifically, the overall goal is to boost the photo-voltaic power generated by the panels. The hope then is to increase the photo-voltaic generated power over the initial baseline reading using the corrective power. Accordingly, when adjustments are made to the amount of corrective power being used, the effects on the photo-voltaic power generated, if any, as compared to the initial baseline reading, and by how much, can be determined.

Next, in step 604, a given amount of corrective power CP1 produced by the corrective power generator is provided to at least one of the panels via the above-described corrective power circuit. As provided above, one exemplary implementation of the present techniques leverages inductive coupling technology as a convenient and effective way to deliver the corrective power to the panels.

In the first case (as exemplified for instance by FIG. 2, described above) a same amount of corrective voltage is delivered to each of the photo-voltaic panels and optimization of the corrective power occurs due to a self-leveling effect wherein the corrective power naturally flows to those panels with a lower power output. See above. In that case, the amount of corrective power CP1 provided to each of the panels in step 604 is self-adjusting based on this self-leveling effect. By way of example only, as provided above a relatively small amount of corrective power (e.g., from about 1% to about 5% and ranges therebetween of the output power from the string of photo-voltaic panels) creates a proportionally large boost in output performance. Thus, according to an exemplary embodiment, in a first iteration of the method, the (given amount of) corrective power employed in step 604 can be anywhere from about 1% to about 5% and ranges therebetween of the initial baseline reading made in step 602.

Figure 9:
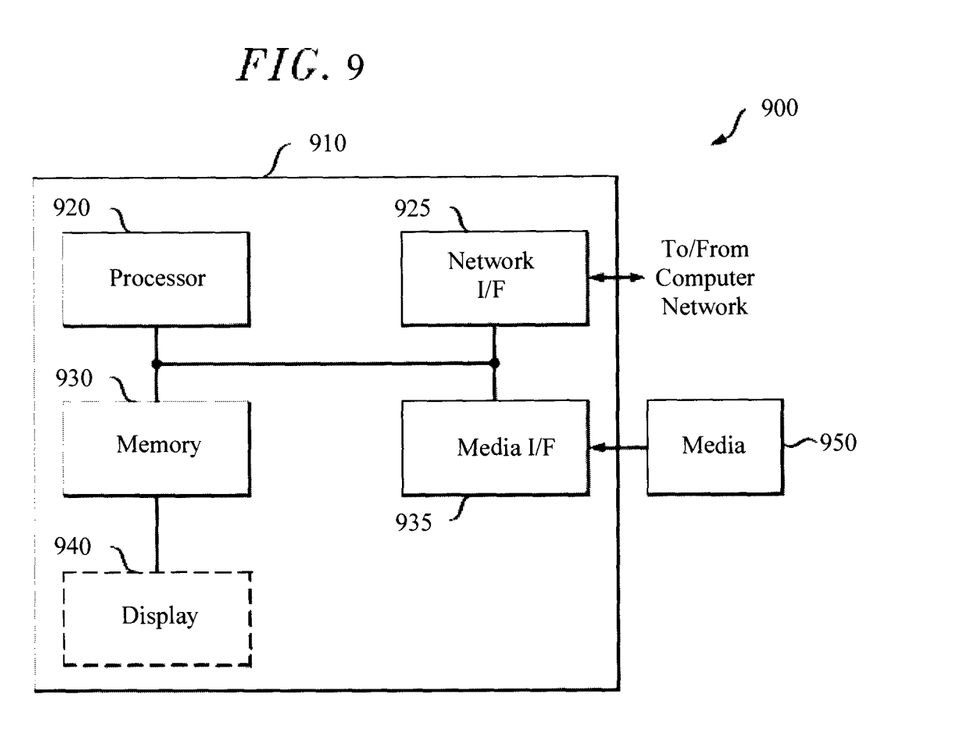
FIG. 9 is a diagram illustrating an exemplary apparatus for performing one or more of the methodologies presented herein according to an embodiment of the present invention.

In the case where, as described above, a control signal is used to fine-tune the amount of corrective power sent to a given photo-voltaic panel (or group of panels), the process is a little more detailed. By way of example only, via the above-described control signal circuitry, a certain amount of the corrective power CP1 is provided to each of the panels (or groups of panels). "Expert" knowledge may be employed in this step to determine the amount of corrective power to be delivered to each panel (or group of panels). For instance, a computer (see, for example, apparatus 900, described below) which has knowledge of (or stores in memory) which corrective power has been optimal for each panel can provide this "expert" knowledge. Based on this knowledge, the corrective power level can be adjusted accordingly. See for example the above description related to the power conditioning units optionally having a knob permitting a user to regulate the amount of corrective power delivered to the panels.

Absent any prior knowledge about panel performance, a certain amount of trial and error may be needed. For instance, in a first iteration of methodology 600, a same amount of corrective power CP1 might be delivered to each of the panels. Then in subsequent iterations (see below), the corrective power delivered to each panel (or groups of panels) can be individually altered (while the photo-voltaic generated power is monitored) to determine its effect on the panel output performance. By way of example only, a computer (such as apparatus 900 described below) has a memory to store past history, a processor (or logic) to make the best decisions, electrical outputs to send commands to the control power generator, or to each power conditioning unit and/or to each power leveling unit.

In either case, in step 606, the photo-voltaic power generated from the string of photo-voltaic panels is measured. The reading taken in this step can then be compared with that from step 602 to determine whether the introduction of the corrective power CP1 to at least one of the panels in step 604 had any effect, and if so how much. Namely, in step 608, a determination is made as to whether (or not) the amount of corrective power supplied in step 606 (i.e., CP1) increased the photo-voltaic generated power.

If it is determined in step 608 that the corrective power supplied in step 606 did not increase the photo-voltaic generated power, then one of two scenarios are possible. In a first scenario, as highlighted above, supplying too much corrective power might have little to no effect on performance. Thus, it may be reasoned that perhaps the amount of corrective power supplied to the panel(s) in step 604 was too high. Accordingly a determination is made in step 610, as to whether a lower amount of corrective power has already been tested, and if not then in step 612 a lesser amount of corrective power (as compared to what was applied in step 604) is implemented. By way of example only, the amount of corrective power can be decreased by increments of about 1% based on the photo-voltaic generated power measurement made in step 602. Step 606 (and subsequent steps) can then be repeated to determine whether this tactic of lowering the corrective power amount has increased the photo-voltaic generated power.

Of course, if multiple iterations of the methodology 600 have already been performed and lower amounts of corrective power have already been investigated, then it may simply be determined when a boost in performance is not achieved that an optimal amount of corrective power is already being implemented. See FIG. 6. This is the second scenario mentioned above. Namely, if in step 610 it is determined that a lower corrective power level has already been tested, then the process can be ended at that point since neither increasing nor decreasing the corrective power any further will boost performance. Preferably, the corrective power optimization process of methodology 600 is repeated at regular intervals in order to insure that the proper amount of corrective power is being provided for the current conditions.

On the other hand, if in step 608 it is determined that the corrective power supplied in step 606 increased the photo-voltaic generated power, then in step 614 additional corrective power adjustments may be made (in an attempt to maximize the output performance). For instance, in the case (of FIG. 2) where the corrective power generator acts as a simple voltage source to provide the same amount of corrective voltage to each panel, then in step 614 a greater amount of corrective power CP2 may be implemented (e.g., wherein CP2>CP1). Via the self-leveling principle, increasing the amount of corrective power provided would provide a proportionally greater amount of power to the weaker performing panels. By way of example only, the amount of corrective power can be increased by increments of about 1% based on the photo-voltaic generated power measurement made in step 602. Step 606 (and subsequent steps) can then be repeated to determine whether this tactic of increasing the corrective power amount has increased the photo-voltaic generated power. In each iteration, the evaluation is performed in step 608 to determine whether the adjustment in corrective power resulted in an increase in photo-voltaic generated power. See above. When an adjustment fails to provide an increase in performance (and when a lower amount of corrective power has already been tested—as per step 610), then the process may be considered as complete since neither increasing nor decreasing the corrective power any further will boost performance. Preferably, the corrective power optimization process of methodology 600 is repeated at regular intervals in order to insure that the proper amount of corrective power is being provided for the current conditions.

Namely, as highlighted above, weak panel performance may be the result of operating conditions, such as shading of the panels—which, e.g., can be the result of passing cloud cover. Since environmental conditions such as cloud cover can change frequently over the course of a day, it is preferable to perform the corrective power optimization process of methodology 600 at regular intervals in order to insure that the proper amount of corrective power is being provided for the current conditions, and that only the amount of the photo-generated power necessary to boost performance is being supplied. For instance, when cloud cover lessens, the output performance of weaker panels needs less corrective power. Thus, according to an exemplary embodiment, methodology 600 is repeated (beginning at step 602) at intervals of from about 10 seconds to about 10 minutes, and ranges therebetween.

In the case (of FIG. 5) wherein specific amounts of the corrective power are directed to specific panels (or groups of panels) via a control signal, absent any user-based knowledge (i.e., about which panels to adjust and by how much—see above) then the adjustment made in step 614 (and subsequent evaluation in steps 606, 608, etc.) may be performed on a panel-by-panel basis. For instance, a greater amount of corrective power CP2 may be implemented (e.g., wherein CP2>CP1) for a first panel (or first group of panels) via the above-described control mechanism. This adjustment can then be measured (step 606) and evaluated (steps 608-614). The process can then move to a second panel (or a second group of panels). The process can operate in a round-robin manner until all the panels (or groups of panels) have been evaluated.

As provided above, the present techniques of providing corrective power to boost performance of a string of photo-voltaic devices can be implemented at a variety of different levels. For instance, in the examples shown illustrated in the figures, the corrective power is introduced (via inductive coupling) to each panel individually. Introducing the corrective power at the level of individual panels is a straightforward process since each panel generally contains multiple interconnected photo-voltaic cells. In the same manner, the present techniques may be implemented at a finer level, for example, at the level of individual photo-voltaic cells, or groups of photo-voltaic cells within a panel. See, for example, FIGS. 7A and 7B.

Figure 7A:
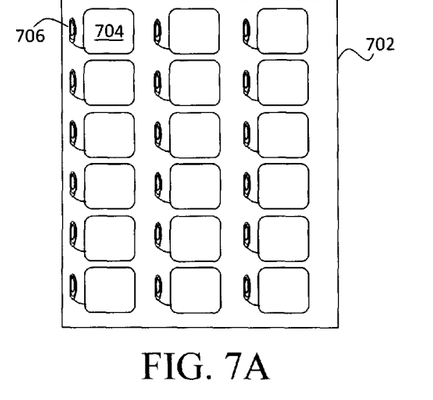
FIG. 7A is a diagram illustrating an exemplary embodiment wherein corrective power (and optionally control signal data) can be transmitted to each photo-voltaic cell within a panel individually via inductive coupling according to an embodiment of the present invention.

By way of example only, a photo-voltaic panel 702 containing multiple photo-voltaic cells 704 is shown in FIG. 7A. Each of the photo-voltaic cells 704 has an inductive coupling coil 706 connected thereto which permits corrective power (and optionally control signal data) to be transmitted to each photo-voltaic cell 704 in the panel individually). For ease and clarity of depiction, the above-described power leveling and/or power conditioning circuits are not shown, but may be implemented in the same manner as described above.

Figure 7B:
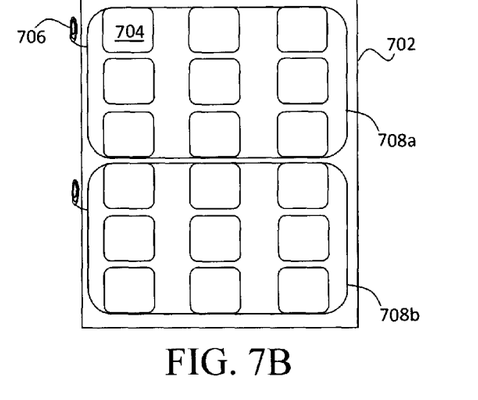
FIG. 7B is a diagram illustrating an exemplary embodiment wherein corrective power (and optionally control signal data) can be transmitted to groups of photo-voltaic cells within a panel via inductive coupling according to an embodiment of the present invention.

A variant of the principle shown in FIG. 7A is shown in FIG. 7B where instead of providing corrective power to each photo-voltaic cell individually, the corrective power is provided (in this case via inductive coupling) individually to groups 708*a*, *b*, etc. of the photo-voltaic cells 704 within the photo-voltaic panel 702). While not shown in the figure, it would be apparent to one skilled in the art how to wire photo-voltaic cells into groups within a panel. As shown in FIG. 7B, each group 708*a*, *b*, etc. of the photo-voltaic cells 704 has an inductive coupling coil 706 connected thereto which permits corrective power (and optionally control signal data) to be transmitted to each group 708*a*, *b*, etc. of photo-voltaic cells 704 in the panel individually. Again, for ease and clarity of depiction, the above-described power leveling and/or power conditioning circuits are not shown, but may be implemented in the same manner as described above.

Figure 8:
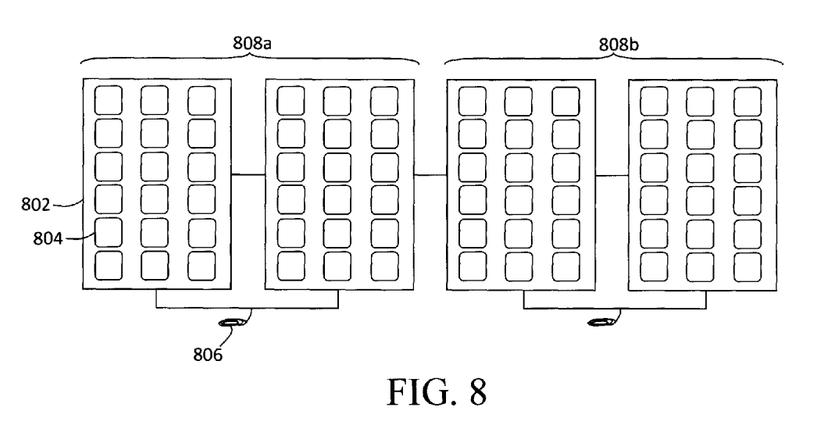
FIG. 8 is a diagram illustrating an exemplary embodiment wherein corrective power (and optionally control signal data) can be transmitted to groups of photo-voltaic panels via inductive coupling according to an embodiment of the present invention.

The present techniques may also be implemented in the same manner at a coarser level, for example, at the level of groups of photo-voltaic panels. See, for example, FIG. 8. As shown in FIG. 8, corrective power (and optionally control signal data) is delivered to groups of photo-voltaic panels 802. Each panel contains multiple photo-voltaic cells 804. In this example, conductive coupling between the corrective power (and optionally the control signal) circuitry (see FIGS. 2 and 5) and groupings of panels 808*a*, *b*, etc. via inductive coupling coils 806.

It is notable that while inductive coupling has been described in the examples and figures as being a good method for delivering the corrective power (and optionally the control signals) to the photovoltaic panels, that is only one exemplary delivery system. In general, any conduit for delivering a corrective power and control signal to photo-voltaic devices can be used to practice the present techniques. For instance, rather than inductive coupling, standard connectors may be employed to link the panels to the corrective power and control signal circuits. This would however entail providing a physical path through the panel casing (which is avoided with inductive coupling).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Turning now to FIG. 9, a block diagram is shown of an apparatus 900 for implementing one or more of the methodologies presented herein. By way of example only, apparatus 900 can be configured to implement one or more of the steps of methodology 600 of FIG. 6 for determining an optimal amount of corrective power to deliver to each panel (or group of panels) so as to optimize photo-voltaic power.

Apparatus 900 comprises a computer system 910 and removable media 950. Computer system 910 comprises a processor device 920, a network interface 925, a memory 930, a media interface 935 and an optional display 940. Network interface 925 allows computer system 910 to connect to a network, while media interface 935 allows computer system 910 to interact with media, such as a hard drive or removable media 950.

Processor device 920 can be configured to implement the methods, steps, and functions disclosed herein. The memory 930 could be distributed or local and the processor device 920 could be distributed or singular. The memory 930 could be implemented as an electrical, magnetic or optical memory, or any combination of these or other types of storage devices. Moreover, the term "memory" should be construed broadly enough to encompass any information able to be read from, or written to, an address in the addressable space accessed by processor device 920. With this definition, information on a network, accessible through network interface 925, is still within memory 930 because the processor device 920 can retrieve the information from the network. It should be noted that each distributed processor that makes up processor device 920 generally contains its own addressable memory space. It should also be noted that some or all of computer system 910 can be incorporated into an application-specific or general-use integrated circuit.

Optional display 940 is any type of display suitable for interacting with a human user of apparatus 900. Generally, display 940 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of optimizing photo-voltaic generated power from a string of photo-voltaic devices, the method comprising the step of:
providing a portion of the photo-voltaic generated power obtained from the string of photo-voltaic devices back to at least one photo-voltaic device in the string of photo-voltaic devices as corrective power to boost performance of the photo-voltaic device and thereby increase overall the photo-voltaic generated power from the string of photo-voltaic devices, wherein the portion of the photo-voltaic generated power provided as the corrective power is from about 1% to about 5%, and ranges therebetween, of the photo-voltaic generated power obtained from the string of photo-voltaic devices.

2. The method of claim 1, wherein the string of photo-voltaic devices is connected to an inverter via a main conducting line carrying the photo-voltaic generated power from the string of photo-voltaic devices, and wherein the corrective power is provided to the at least one photo-voltaic device via a corrective power conducting line connected to the inverter that is separate from the main conducting line.

3. The method of claim 1, wherein each photo-voltaic device in the string of photo-voltaic devices comprises a photo-voltaic panel having multiple photo-voltaic cells.

4. The method of claim 1, wherein the corrective power is provided to the at least one photo-voltaic device using inductive coupling.

5. The method of claim 1, further comprising the step of:
individually regulating an amount of the corrective power that is provided to each photo-voltaic device in the string of photo-voltaic devices.

6. The method of claim 5, further comprising the step of:
providing a control signal to the at least one photo-voltaic device to regulate the amount of the corrective power that is provided to the at least one photo-voltaic device.

7. The method of claim 1, further comprising the steps of:
measuring an initial photo-voltaic generated power from the string of photo-voltaic devices;
providing a given amount of the corrective power to the at least one photo-voltaic device; and
measuring the photo-voltaic generated power from the string of photo-voltaic devices after the given amount of the corrective power has been provided to the at least one photovoltaic device to determine whether the given amount of the corrective power provided to the at least one photo-voltaic device increased the photo-voltaic generated power from the string of photo-voltaic devices.

8. The method of claim 7, further comprising the steps of:
increasing an amount of the corrective power provided to the at least one photo-voltaic device; and
measuring the photo-voltaic generated power from the string of photo-voltaic devices after the amount of the corrective power provided to the at least one photo-voltaic device has been increased to determine whether increasing the amount of the corrective power provided to the at least one photo-voltaic device increased the photo-voltaic generated power from the string of photo-voltaic devices.

9. A system for optimizing photo-voltaic generated power, the system comprising:
a string of photo-voltaic devices;
a corrective power generator connected to at least one photo-voltaic device in the string of photo-voltaic devices via a corrective power conducting line, wherein the corrective power generator is configured to provide corrective power to the at least one photo-voltaic device via the corrective power conducting line to optimize the photo-voltaic generated power from the string of photo-voltaic devices; and
a conducting line connected to the corrective power generator, wherein the conducting line is configured to carry a portion of the photo-voltaic generated power obtained from the string of photo-voltaic devices back to the corrective power generator, and wherein the portion of the photo-voltaic generated power carried back to the corrective power generator by the conducting line is from about 1% to about 5%, and ranges therebetween, of the photo-voltaic generated power from the string of photo-voltaic devices.

10. The system of claim 9, wherein the string of photo-voltaic devices is connected to an inverter via a main conducting line, and wherein the conducting line links the inverter and the corrective power generator such that photo-voltaic generated power from the string of photo-voltaic devices is used by the corrective power generator to produce the corrective power.

11. The system of claim 9, wherein each photo-voltaic device in the string of photo-voltaic devices comprises a photo-voltaic panel having multiple photo-voltaic cells.

12. The system of claim 9, further comprising:
at least one first coil connected to the corrective power conducting line; and
at least one second coil connected to the at least one photo-voltaic device, wherein the at least one first coil and the at least one second coil form an inductance coupling coil pair for the at least one photo-voltaic device.

13. The system of claim 12, further comprising:
a power leveling circuit between the at least one second coil and the at least one photo-voltaic device, wherein the power leveling circuit comprises a rectifier configured to convert AC power to DC power.

14. The system of claim 13, wherein the power leveling circuit comprises:
at least one diode between the at least one second coil and the at least one photo-voltaic device.

15. The system of claim 12, further comprising:
a power conditioning circuit between the at least one first coil and the corrective power conducting line, wherein the power conditioning circuit is configured to regulate an amount of the corrective power provided to the at least one photo-voltaic device.

16. The system of claim 9, further comprising:
a control signal generator connected to the at least one photo-voltaic device via the corrective power line, wherein the control signal generator is configured to provide a control signal to the at least one photo-voltaic device to regulate an amount of the corrective power provided to the at least one photo-voltaic device.

17. A method of using a system for optimizing photo-voltaic generated power, the method comprising the steps of:
providing a string of photo-voltaic devices; and
providing corrective power to at least one photo-voltaic device in the string of photovoltaic devices using a corrective power generator which is connected to the at least one photo-voltaic device via a corrective power conducting line to optimize the photo-voltaic generated power from the string of photo-voltaic devices, wherein the corrective power comprises a portion of the photo-voltaic generated power obtained from the string of photo-voltaic devices that is carried back to the corrective power generator, and wherein the corrective power is from about 1% to about 5%, and ranges therebetween, of the photo-voltaic generated power obtained from the string of photo-voltaic devices.

18. The method of claim 17, wherein the system further comprises i) at least one first coil connected to the corrective power conducting line; and ii) at least one second coil connected to the at least one photo-voltaic device, wherein the at least one first coil and the at least one second coil form an inductance coupling coil pair for the at least one photo-voltaic device, the method further comprising the step of:

providing the corrective power to the at least one photo-voltaic device using inductive coupling between the inductance coupling coil pair for the at least one photo-voltaic device.

19. The method of claim 18, wherein the system further comprises a power leveling circuit between the at least one second coil and the at least one photo-voltaic device, the method further comprising the step of:

converting the corrective power from AC to DC within the at least one photo-voltaic device using the power leveling circuit.

20. The method of claim 18, wherein the system further comprises a power conditioning circuit between the at least one first coil and the corrective power conducting line, the method further comprising the step of:

regulating an amount of the corrective power provided to the at least one photo-voltaic device using the power conditioning circuit.

21. The method of claim 18, wherein the system further comprises a control signal generator connected to the at least one photo-voltaic device via the corrective power line, the method further comprising the step of:

providing a control signal to the at least one photo-voltaic device using the control signal generator to regulate an amount of the corrective power provided to the at least one photo-voltaic device.

* * * * *